(12) United States Patent
Huang

(10) Patent No.: US 7,528,636 B2
(45) Date of Patent: May 5, 2009

(54) LOW DIFFERENTIAL OUTPUT VOLTAGE CIRCUIT

(75) Inventor: Chun-Yi Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/762,075

(22) Filed: Jun. 13, 2007

(65) Prior Publication Data

US 2008/0238521 A1  Oct. 2, 2008

(30) Foreign Application Priority Data

Mar. 26, 2007  (TW) ............................... 96110321 A

(51) Int. Cl.
  *H03K 3/00* (2006.01)
(52) U.S. Cl. .................. 327/108; 327/109; 327/110; 327/111; 327/112
(58) Field of Classification Search .................. 327/108
See application file for complete search history.

(56) References Cited

U.S. PATENT DOCUMENTS

2002/0190754 A1* 12/2002 Brunolli ...................... 326/83
2006/0158223 A1* 7/2006 Wang et al. .................. 326/86

* cited by examiner

*Primary Examiner*—Donovan Lincoln
*Assistant Examiner*—Daniel Rojas
(74) *Attorney, Agent, or Firm*—Jianq Chyun IP Office

(57) ABSTRACT

A low differential output voltage circuit having a voltage generator and a differential output unit is provided. The voltage generator includes a first PMOS transistor, a first amplifier circuit, a unit gain stage, a first NMOS transistor, a second NMOS transistor. The differential output unit includes a first controlled current source, a second controlled current source, a common voltage circuit, a first switch, a second switch, a third switch, and a fourth switch. Due to the voltage generator directly provides a common mode voltage to the differential output unit, and the first amplifier circuit and the unit gain stage could overcome a channel modulation effect of MOS transistors and enhance the driving ability of the common mode voltage respectively. Thus, a response time of the invention is decreased, and an output current of the differential output unit is in a proportion to the reference current received by the voltage generator.

13 Claims, 7 Drawing Sheets

US 7,528,636 B2

LOW DIFFERENTIAL OUTPUT VOLTAGE CIRCUIT

CROSS-REFERENCE TO RELATED APPLICATION

This application claims the priority benefit of Taiwan application serial no. 96110321, filed Mar. 26, 2007. All disclosure of the Taiwan application is incorporated herein by reference.

BACKGROUND OF THE INVENTION

1. Field of the Invention

The present invention relates to an output circuit. More particularly, the present invention relates to a low differential output voltage circuit.

2. Description of Related Art

In recent years, diverse electronic products have been developed. In order to realize communication between electronic products, between integrated circuits, or between various functional modules in integrated circuits to optimize functions of each product, various transmission interfaces came into being.

In order to reduce electromagnetic interference (EMI) and power consumption, transmission interfaces are mostly designed to be a differential output type, for example, a differential output circuit in FIG. 1. FIG. 1 is a schematic view of a conventional differential output circuit and an arrangement thereof. Referring to FIG. 1, the differential output circuit is disposed in a chip, and the circuit includes a differential output unit composed of metal-oxide-semiconductor (MOS) transistors 102-112 and resistors 114, 116, and a feedback circuit 130. The differential output unit outputs a differential signal, and work together with the feedback circuit 130 to perform a feedback control of the common mode voltage Vcm.

In FIG. 1, Vout+ and Vout− are output signals of the circuit, for transmitting communication messages to a receiving end (e.g. another chip, not shown) outside the chip, and Vin+ and Vin− are input signals of the circuit. Moreover, VCC is the source voltage, GND is the grounding voltage, and Vp is the bias provided to the transistor. Transistors 104 and 106 form an input differential pair, transistors 108 and 110 form another input differential pair, and transistors 102 and 112 serve as the current source of the input differential pairs. Resistors 114 and 116 are used to connect the output signals Vout+ and Vout− in series to obtain a common mode voltage Vcm of the two output signals. Resistors 118 and 120 are terminal resistors of the circuit and a receiving end for impedance matching to reduce the interference caused by signal reflection.

After acquiring the common mode voltage Vcm, the feedback circuit 130 will compare the common mode voltage Vcm with a predetermined reference voltage, for example, 1.25V to output a control signal Vn to a gate of the transistor 112 and further control the current of the transistor 112, so that the common mode voltage Vcm can be kept at 1.25V. However, it is necessary for the differential output unit to perform the feedback control through the feedback circuit 130, so the response time of the transmission interface of this type is limited, and the optimized conditions will drift with the variation of the processes.

In addition, as a common chip usually has a plurality of differential output units, and each of the differential output units works needs one feedback circuit to perform the feedback control, the cost is greatly increased. It can be seen from the above disadvantages that the more the differential signals to be transmitted by the system are, the more complex and larger the circuit scale is.

SUMMARY OF THE INVENTION

Accordingly, the present invention is directed to a low differential output voltage circuit with a shorter response time than that of the conventional circuit.

The present invention is also directed to a low differential output voltage circuit, in which the optimized conditions thereof will not easily drift with the variation of the processes.

The present invention is further directed to a low cost low differential output voltage circuit compared to that of the conventional circuit.

The present invention is also directed to a low differential output voltage circuit with a smaller circuit area compared to that of the conventional circuit.

As embodied and broadly described herein, a low differential output voltage circuit provided by the present invention includes a voltage generator and a differential output unit. The differential output unit includes a first controlled current source, a first switch, a second switch, a third switch, a fourth switch, a second controlled current source, and a common mode voltage circuit.

As embodied and broadly described herein, a low differential output voltage circuit provided by the present invention includes a voltage generator and a plurality of differential output units. Each of the differential output units includes a first controlled current source, a first switch, a second switch, a third switch, a fourth switch, a second controlled current source, and a common mode voltage circuit.

The voltage generator generates a first bias, a second bias, and a clamping voltage. The first controlled current source provides a current of a value clamped within a first predetermined range according to the first bias. The first switch has a first end coupled to the first controlled current source, a second end, and a control end receiving a first sequence signal to determine whether to turn on or not. The second switch has a first end coupled to the first controlled current source, a second end, and a control end receiving a second sequence signal to determine whether or not to turn on.

The third switch has a first end coupled to the second end of the first switch and outputting a first output signal, a second end, and a control end receiving a third sequence signal to determine whether or not to turn on. The fourth switch has a first end coupled to the second end of the second switch and outputting a second output signal, a second end, and a control end receiving a fourth sequence signal to determine whether or not to turn on. The second controlled current source is coupled to the second end of the third switch and the second end of the fourth switch, and provides a current of a value clamped within a second predetermined range. The common mode voltage circuit clamps the common mode voltage of the first output signal and the second output signal within a third predetermined range according to the clamping voltage.

In a low differential output voltage circuit according to an embodiment of the present invention, the first switch and the second switch are implemented by PMOS transistors, and the third switch and the fourth switch are implemented by NMOS transistors. The first controlled current source is also implemented by a PMOS transistor which has a source coupled to the source voltage, a drain coupled to the source of the PMOS transistor serving as the first switch and the source of the PMOS transistor serving as the second switch, and a gate receiving a first bias. The second controlled current source is also implemented by an NMOS transistor which has a drain coupled to the source of the NMOS transistor serving as the third switch and the source of the NMOS transistor serving as the fourth switch, a source coupled to a common potential, and a gate receiving a second bias. In addition, the voltage generator is implemented by a first NMOS transistor, a second NMOS transistor, a first PMOS transistor, a first amplifier circuit, and a unit gain stage, and the unit gain stage is implemented by a second amplifier circuit.

The first NMOS transistor has a drain and a gate connected to the drain. The drain of the first NMOS transistor receives a reference current, and a source of the first NMOS transistor is coupled to a common potential. The second NMOS transistor has a source coupled to the common potential, and a gate coupled to the gate of the first NMOS transistor and outputting a second bias. The first PMOS transistor has a source coupled to the source voltage, and a drain coupled to a drain of the second NMOS transistor.

The first amplifier circuit has a positive input end coupled to the drain of the second NMOS transistor and the drain of the first PMOS transistor for clamping the voltages of the two drains at the reference voltage, a negative input end coupled to a reference voltage, and an output end coupled to a gate of the first PMOS transistor and outputting the first bias. The second amplifier circuit has a positive input end receiving the reference voltage, a negative input end, and an output end outputting and feeding the clamping voltage back to the negative input end of the second amplifier circuit.

In this embodiment, the size of the first PMOS transistor is proportional to that of the PMOS transistor serving as the first controlled current source, the size of the second NMOS transistor is proportional to that of the NMOS transistor serving as the second controlled current source. The sizes of the PMOS transistor serving as the first switch and the PMOS transistor serving as the second switch are the same, and the sizes of the NMOS transistor serving as the third switch and the NMOS transistor serving as the fourth switch are the same.

In a low differential output voltage circuit according to another embodiment of the present invention, the first switch and the second switch are implemented by PMOS transistors, and the third switch and the fourth switch are implemented by NMOS transistors. The first controlled current source is also implemented by a PMOS transistor which has a source coupled to the source voltage, a drain coupled to the source of the PMOS transistor serving as the first switch and the source of the PMOS transistor serving as the second switch, and a gate receiving a first bias. The second controlled current source is also implemented by an NMOS transistor which has a drain coupled to the source of the NMOS transistor serving as the third switch and the source of the NMOS transistor serving as the fourth switch, a source coupled to a common potential, and a gate receiving a second bias.

In addition, the voltage generator is implemented by a first NMOS transistor, a second NMOS transistor, a first PMOS transistor, a first amplifier circuit, a first impedor, a second impedor, and a unit gain stage, and the unit gain stage is implemented by a second amplifier circuit. The first impedor and the second impedor are respectively implemented by a PMOS transistor and an NMOS transistor.

The first NMOS transistor has a drain and a gate connected to the drain. The drain of the first NMOS transistor receives a reference current, and a source of the first NMOS transistor is coupled to a common potential. The second NMOS transistor has a source coupled to a common potential, and a gate coupled to the gate of the first NMOS transistor and outputting a second bias. The first PMOS transistor has a source coupled to the source voltage, and a drain coupled to the source of the PMOS transistor serving as the first impedor.

The PMOS transistor serving as the first impedor has a drain coupled to the drain of the NMOS transistor serving as the second impedor, and a gate coupled to the common potential. The NMOS transistor serving as the second impedor has a source coupled to the drain of the second NMOS transistor, and a gate receiving the bias voltage.

The first amplifier circuit has a positive input end coupled to the drain of the PMOS transistor serving as the first impedor and the drain of the NMOS transistor serving as the second impedor for clamping the voltages of the two drains at the reference voltage, a negative input end coupled to the reference voltage, and an output end coupled to the gate of the first PMOS transistor, and outputting the first bias. The second amplifier circuit has a positive input end receiving the reference voltage, a negative input end, and an output end outputting and feeding the clamping voltage back to the negative input end of the second amplifier circuit.

In this embodiment, the size of the first PMOS transistor is proportional to the size of the PMOS transistor serving as the first controlled current source, the size of the PMOS transistor serving as the first impedor is proportional to the size of the PMOS transistor serving as the first switch, the size of the NMOS transistor serving as the second impedor is proportional to the size of the NMOS transistor serving as the fourth switch, and the size of the second NMOS transistor is proportional to the size of the NMOS transistor serving as the second controlled current source. The sizes of the PMOS transistor serving as the first switch and the PMOS transistor serving as the second switch are the same, and the sizes of the NMOS transistor serving as the third switch and the NMOS transistor serving as the fourth switch are the same.

In the present invention, as the voltage generator is used to directly provide the common mode voltage to the differential output unit, the circuit has a short response time, and the optimized conditions thereof will not drift with the variation of the processes easily. According to the present invention, a first amplifier circuit is also adopted in the voltage generator for clamping the drain voltage of the first PMOS transistor and the second NMOS transistor at predetermined reference voltage, thereby overcoming the channel modulation effect of the MOS transistor. Therefore, the output current of the differential output unit is made to be proportional to the reference current of the voltage generator only by adjusting the sizes of the first PMOS transistor, the second NMOS transistor, the first controlled current source (e.g. a PMOS transistor), and the second controlled current source (e.g. an NMOS transistor).

In addition, a second amplifier circuit is also adopted in the voltage generator to provide current to keep the common mode voltage at the level of the reference voltage. Therefore, in the present invention, only one voltage generator is required to connect a plurality of differential output units in series, so that the circuit area of the present invention is smaller than that of the conventional circuit, thereby reducing the cost.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

For the convenience of comparison between different figures, the source voltages and the common potentials are respectively indicated by VCC and COM in the figures.

Figure 1:
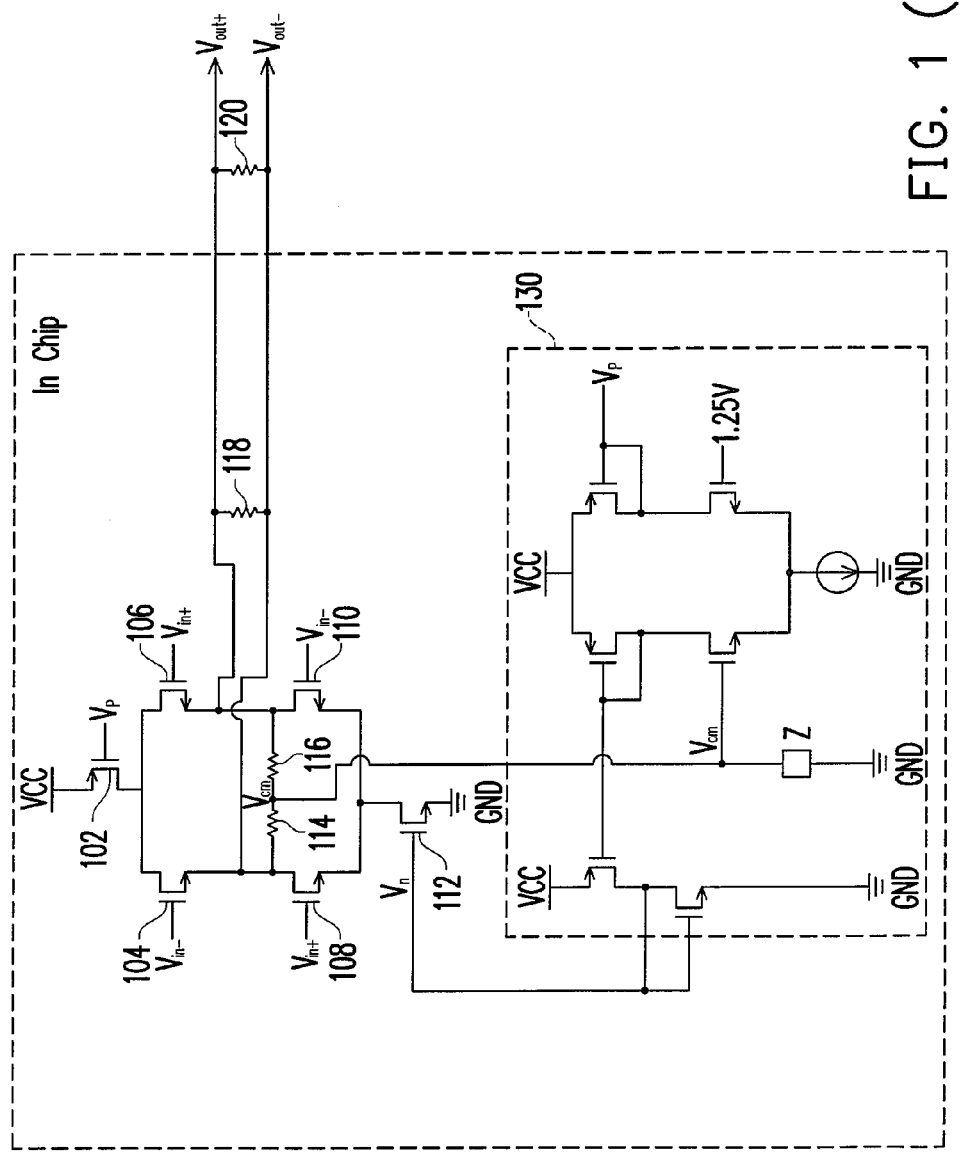
FIG. 1 is a schematic view of a conventional differential output circuit and an arrangement thereof.
Figure 2:
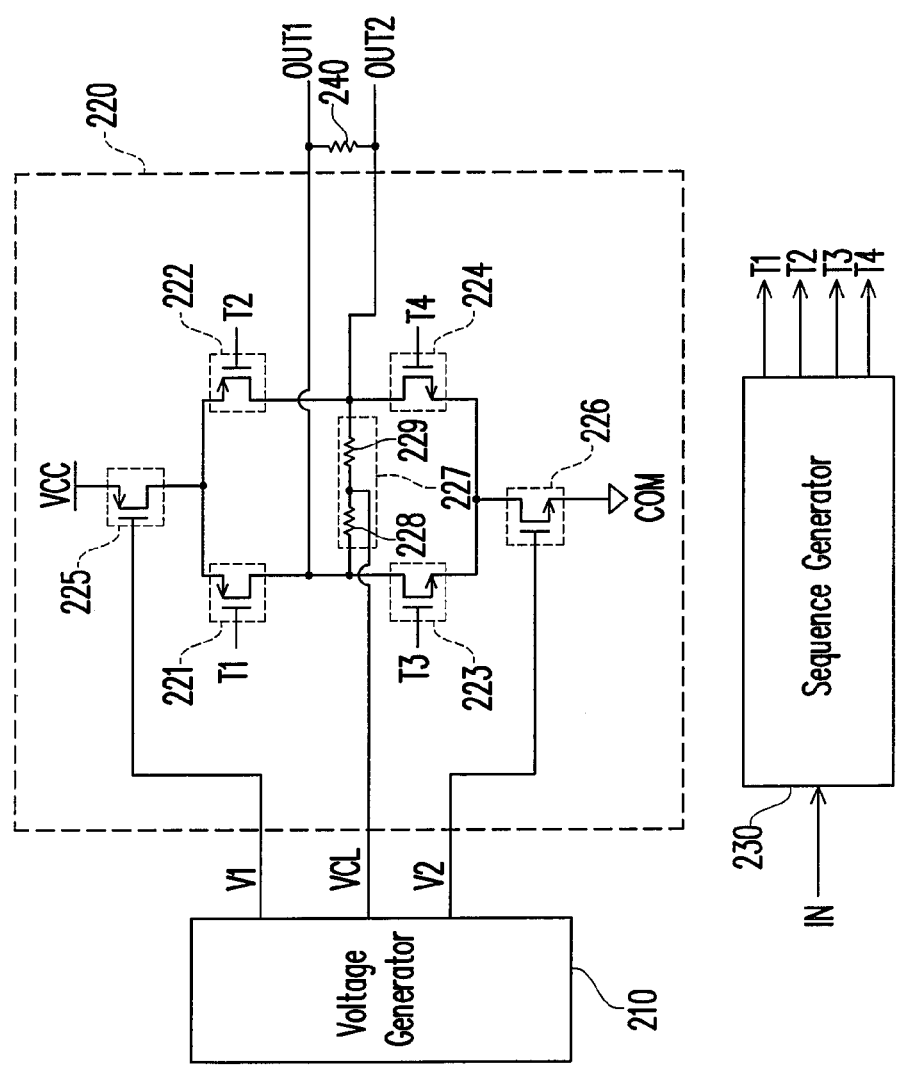
FIG. 2 is a circuit diagram of a low differential output voltage circuit according to an embodiment of the present invention.

Referring to FIG. 2, a circuit diagram of a low differential output voltage circuit according to an embodiment of the present invention is shown. The low differential output voltage circuit includes a voltage generator 210 and a differential output unit 220. The differential output unit 220 is composed of switches 221-224, controlled current sources 225-226, and a common mode voltage circuit 227.

The voltage generator 210 generates biases V1, V2 and a clamping voltage VCL. The controlled current source 225 provides a current of a value clamped within a first predetermined range according to the bias V1, and the controlled current source 226 provides a current of a value clamped within a second predetermined range according to the bias V2. Each of the switches 221-224 has a first end, a second end, and a control end, and the control ends of the switches 221-224 respectively receive sequence signals T1-T4 to determine whether or not to turn on. The common mode voltage circuit 227 clamps the common mode voltages of the output signals OUT1 and OUT2 within a third predetermined range according to the clamping voltage VCL. In addition, a sequence generator 230 can be used to receive an input signal IN (containing the communication information), so as to generate the required sequence signals T1-T4.

In this embodiment, the switches 221, 222 and the controlled current source 225 are implemented by PMOS transistors, and the switches 223, 224 and the controlled current source 226 are implemented by NMOS transistors. As the coupling means of the drain, the source, and the gate of each transistor is exhibited in FIG. 2, the details will not be described herein again. The common mode voltage circuit 227 in this embodiment is implemented by impedors 228 and 229 which are resistors. In addition, an end resistor 240 can be disposed in this circuit, so as to making impedance matching with a receiving end (not shown), thus reducing the interference caused by signal reflection. It should be noted that the resistance of the impedors 228 and 229 are generally set to be several thousands of ohms and even greater, and the resistance of the end resistor 240 is mostly set to be about 100 ohms. In a word, the resistance of the impedors 228 and 229 is much greater than that of the end resistor 240, such that a correct common mode voltage can be achieved with less power consumption.

The switches 221 and 222 are a current switch pair, and the switches 223 and 224 are another current switch pair. These current switches control the flowing direction of the current according to the sequence signals T1-T4. For example, if the output signal OUT1 is required to be positive and the output signal OUT2 is required to be negative, the sequence signals T2 and T4 are set to be at a high potential, and the sequence signals T1 and T3 are set to be at a low potential, such that most of the current passes through the controlled current source 225, the switch 221, the end resistor 240, the switch 224, and the controlled current source 226 sequentially, and finally reach the common potential COM, and a small portion of the current passes through the impedors 228 and 229 and flows to the common potential COM. Therefore, the output signal OUT1 is positive, and the output signal OUT2 is negative.

Similarly, if the output signal OUT1 is required to be negative and the output signal OUT2 is required to be positive, the sequence signals T2 and T4 are set to be at a low potential, and the sequence signals T1 and T3 are set to be at a high potential, such that most of the current passes through the controlled current source 225, the switch 222, the end resistor 240, the switch 223, and the controlled current source 226 sequentially, and finally reach the common potential COM, and a small portion of the current passes through the impedors 229 and 228 and flows to the common potential COM. Therefore, the output signal OUT1 is negative, and the output signal OUT2 is positive. However, regardless of whether the value of the output signal is positive or negative, since the common mode voltage is the clamping voltage VCL, the output signal has positive-negative changes around the clamping voltage VCL.

Figure 3:
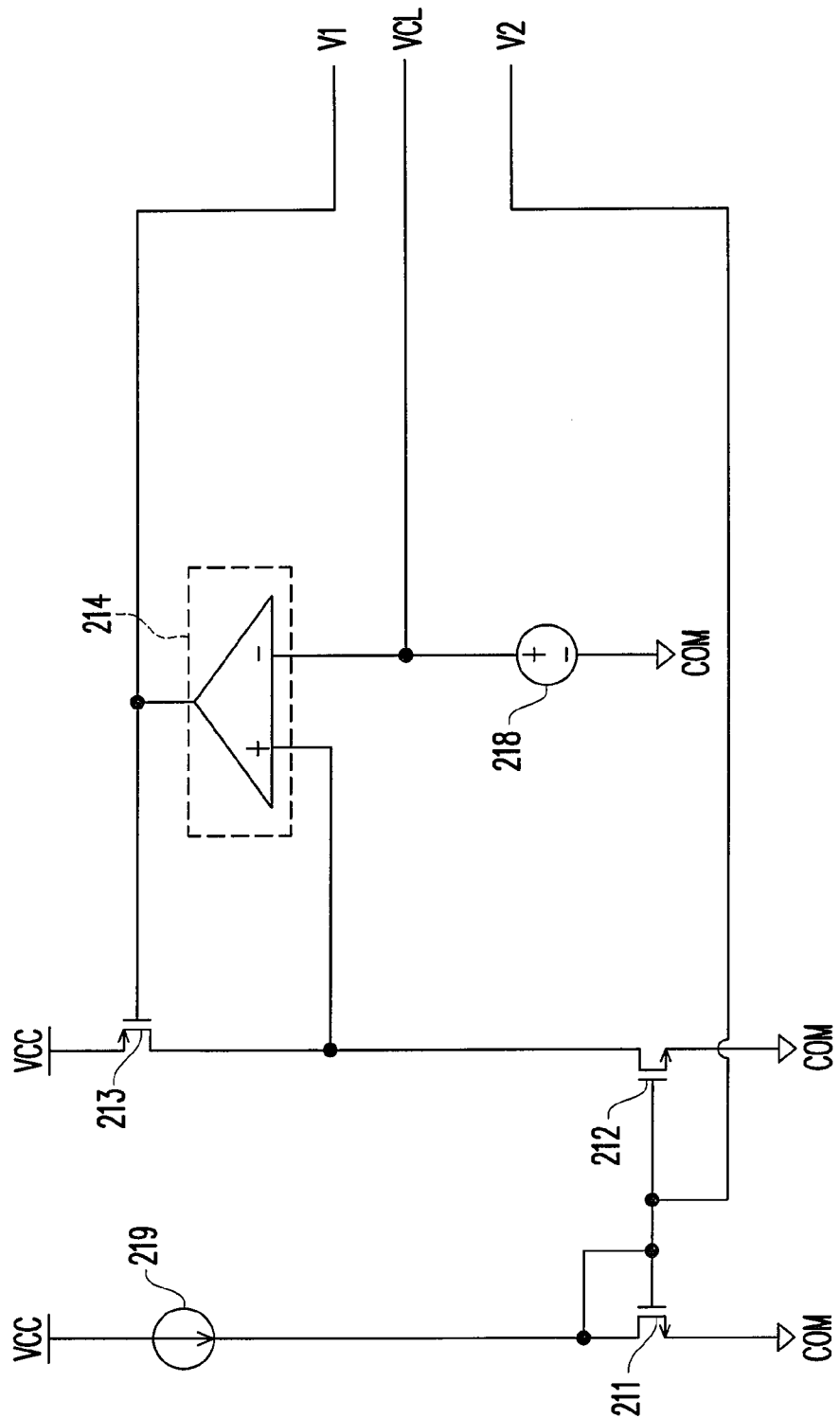
FIG. 3 is a circuit diagram of a voltage generator 210 according to an embodiment of the present invention.

FIG. 3 is a circuit diagram of a voltage generator 210 according to an embodiment of the present invention. The voltage generator 210 in this figure is implemented by the NMOS transistors 211, 212, the PMOS transistors 213, and the amplifier circuit 214. The NMOS transistor 211 and 212 form a current mirror, and the drain of the NMOS transistor 211 receives a reference current 219. Thus, the current (i.e. mirror current) of the NMOS transistor 212 is in proportion to the reference current 219 according to the ratio of sizes of the NMOS transistors 211 and 212. The negative input end of the amplifier circuit 214 is coupled to the reference voltage 218, and the positive input end is coupled to the drains of the NMOS transistor 212 and the PMOS transistor 213. As the amplifier circuit has a characteristic of "virtual short", the voltages of the two drains can be clamped at the level of the reference voltage 218, thus overcoming the channel modulation effect of the MOS transistor, such that the currents of the NMOS transistor 212 and the PMOS transistor 213 are the same.

The biases V1 and V2 are respectively provided by the output end of the amplifier circuit 214 and the gate of the NMOS transistor 212, and the reference voltage 218 directly serves as the common mode voltage for the differential output unit 220 (as shown in FIG. 2). It can be seen from FIG. 3 that since the common mode voltage required by the differential output unit 220 (as shown in FIG. 2) is directly provided by the reference voltage 218 instead of the feedback mechanism. Therefore, for the overall low differential output voltage circuit, the response time is shorter than that of the conventional circuit, and the optimized conditions thereof will not easily drift with the variation of the processes.

Moreover, the above reference voltage 218 can be provided by a voltage source. The coupling means of the voltage source is as shown in FIG. 3. And, the voltage source has a positive end coupled to the negative input end of the amplifier circuit 214, and a negative end coupled to the common potential COM.

Referring to FIGS. 2 and 3 again, as the NMOS transistor serving as the controlled current source 226 in FIG. 2 and the NMOS transistors 211, 212 in FIG. 3 form the current mirror. By controlling the sizes of the PMOS transistor 213 and the PMOS transistor serving as the controlled current source 225 to be proportional, controlling the sizes of the NMOS transistor 212 and the NMOS transistor serving as the controlled current source 226 to be proportional, making the sizes of the PMOS transistor serving as the switch 221 and the PMOS transistor serving as the switch 222 to be the same, and making the sizes of the NMOS transistor serving as the switch 223 and the NMOS transistor serving as the switch 224 to be the same, the output current of the differential output unit 220 will be proportional to the reference current 219. In this manner, the magnitude of the output current of the differential output unit 220 can be directly controlled by the value of the reference current 219.

In order to make the proportion of the output current of the differential output unit 220 and the reference current 219 exactly conform to a proportion set by a user, the user can set the sizes of the PMOS transistor 213 and the NMOS transistor 212 to be the same, and set the sizes of the PMOS transistor serving as the controlled current source 225 and the NMOS transistor serving as the controlled current source 226 to be the same, and thus the mirror current is in proportion to the reference current 219, and the currents of the controlled current sources 225 and 226 can be in proportion to the mirror current. The user also can set the sizes of the PMOS transistor 213, the NMOS transistor 212, the PMOS transistor serving as the controlled current source 225, and the NMOS transistor serving as the controlled current source 226 to be the same, such that the mirror current and the currents of the controlled current sources 225 and 226 are in proportion to the reference current 219. Moreover, the sizes of the PMOS transistor 213, the NMOS transistors 211, 212, the PMOS transistor serving as controlled current source 225, and the NMOS transistor serving as the controlled current source 226 can be set to be the same, such that the mirror current and the currents of the controlled current sources 225, 226 are identical to the reference current 219.

Figure 4:
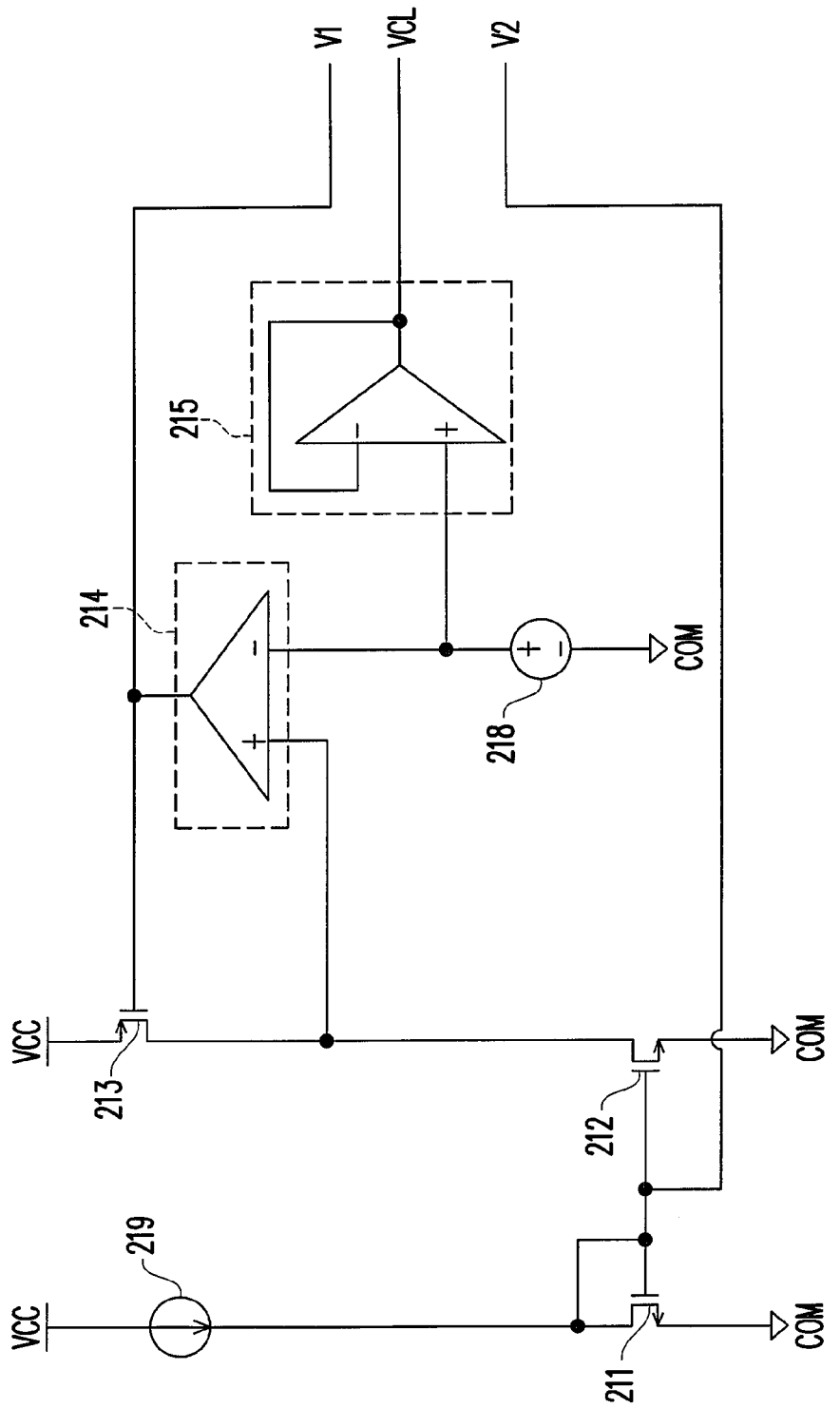
FIG. 4 is a circuit diagram of a voltage generator 210 according to another embodiment of the present invention.

In addition, if the user intends to enhance the driving ability of the common mode voltage, a unit gain stage can be added in the voltage generator 210 in FIG. 3, as shown in FIG. 4. FIG. 4 is a circuit diagram of the voltage generator 210 according to another embodiment of the present invention. The unit gain stage 215 in FIG. 4 can also be implemented by an amplifier circuit. The positive input end of the amplifier circuit receives a reference voltage 218, and the output end outputs a clamping voltage VCL to serve as the common mode voltage required by the differential output unit 220, and the output of the amplifier circuit is fed back to the negative input end of the amplifier circuit to form a unit gain. Since the amplifier circuit can provide current to keep the common mode voltage at the level of the reference voltage, the voltage generator 210 has the ability to drive a plurality of differential output units 220 (described hereinafter) which are connected in series at the same time.

Figure 5:
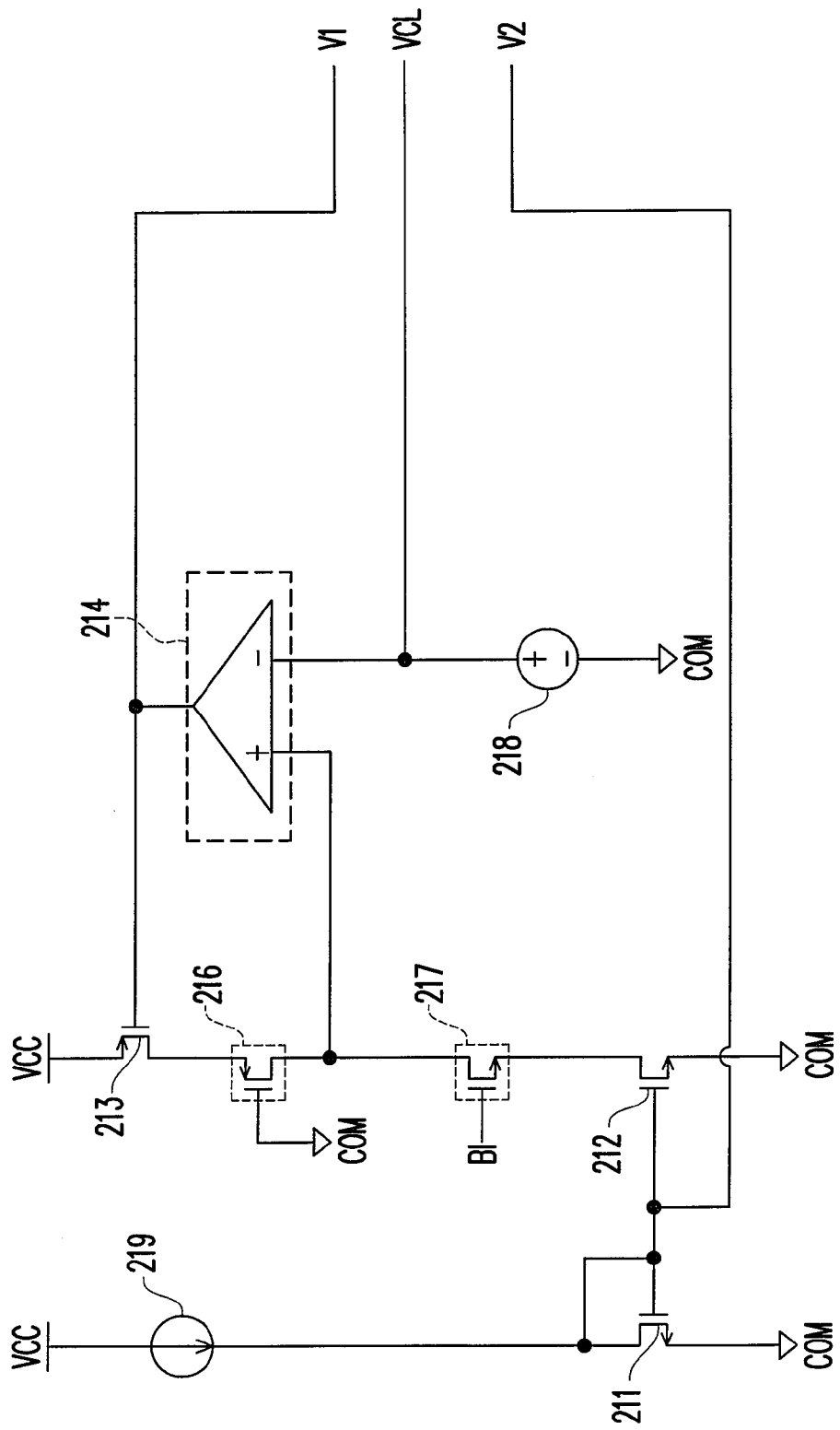
FIG. 5 is a circuit diagram of a voltage generator 210 according to still another embodiment of the present invention.

From the teaching of FIG. 2 and the relevant description, in consideration of the internal resistance of the switch on the current path of the differential output unit 220, several impedors can be added on the mirror current path of the voltage generator 210 in FIG. 3 to simulate the internal resistance of switch, so as to make impedance matching, as shown in FIG. 5. FIG. 5 is a circuit diagram of the voltage generator 210 according to still another embodiment of the present invention. The impedors 216 and 217 in FIG. 5 are the added impedors, which are respectively implemented by a PMOS transistor and an NMOS transistor in this embodiment. The gates of the PMOS transistor and the NMOS transistor are respectively coupled to a common potential COM and a bias voltage BI, so as to maintain the two transistors at a turn-on state, thereby matching the internal resistance of switch by the use of the turn-on internal resistance.

As the sizes of the PMOS transistor serving as the switch 221 and the PMOS transistor serving as the switch 222 in the differential output unit 220 are set to be the same, and the sizes of the NMOS transistor serving as the switch 223 and the NMOS transistor serving as the switch 224 are also set to be the same, only by making the sizes of the PMOS transistor serving as the impedor 216 and the PMOS transistor serving as the switch 221 to be proportional and making the sizes of the NMOS transistor serving as the impedor 217 and the NMOS transistor serving as the switch 224 to be proportional, the output current of the differential output unit 220 will be proportional to the reference current 219.

Figure 6:
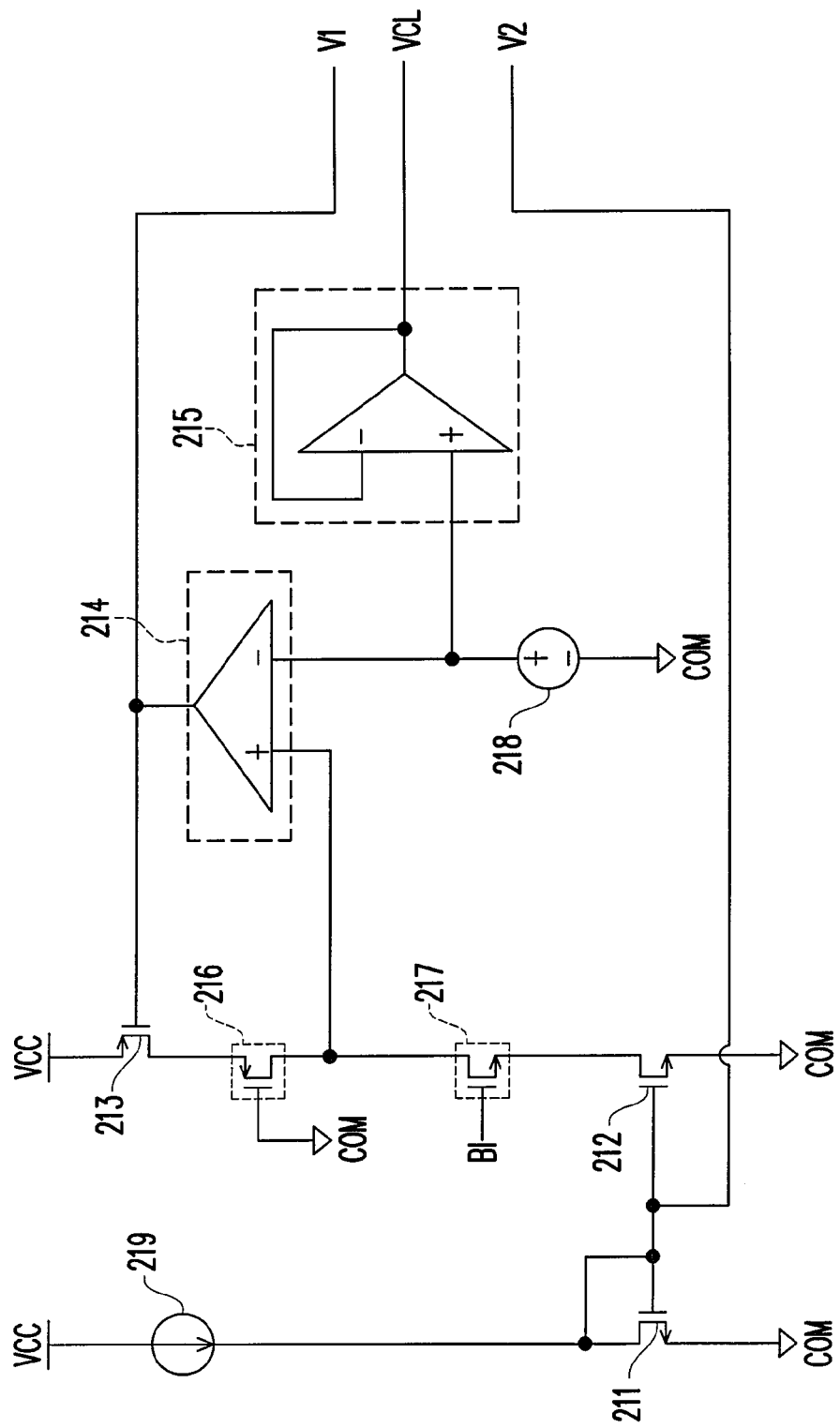
FIG. 6 is a circuit diagram of a voltage generator 210 according to yet another embodiment of the present invention.

The advanced user can use all the above newly added components in the voltage generator 210, so as to realize the best performance of the voltage generator 210, as shown in FIG. 6. FIG. 6 is a circuit diagram of the voltage generator 210 according to yet another embodiment of the present invention. The amplifier circuit 214, the unit gain stage 215, and impedors 216, 217 in FIG. 6 are all the newly added components, and the functions thereof has been described in the above embodiments and will not be described herein again.

Furthermore, according to the above description, the unit gain stage 215 can be employed in the voltage generator 210 to enhance the driving ability of the common mode voltage and provide current to maintain the common mode voltage at the level of the reference voltage. The output current of the differential output unit 220 is made to be in proportion to the reference current 219 by adjusting the sizes of the MOS transistors. Therefore, in the present invention, only one voltage generator is used to connect a plurality of differential output units 220 in series at the same, as shown in FIG. 7.

Figure 7:
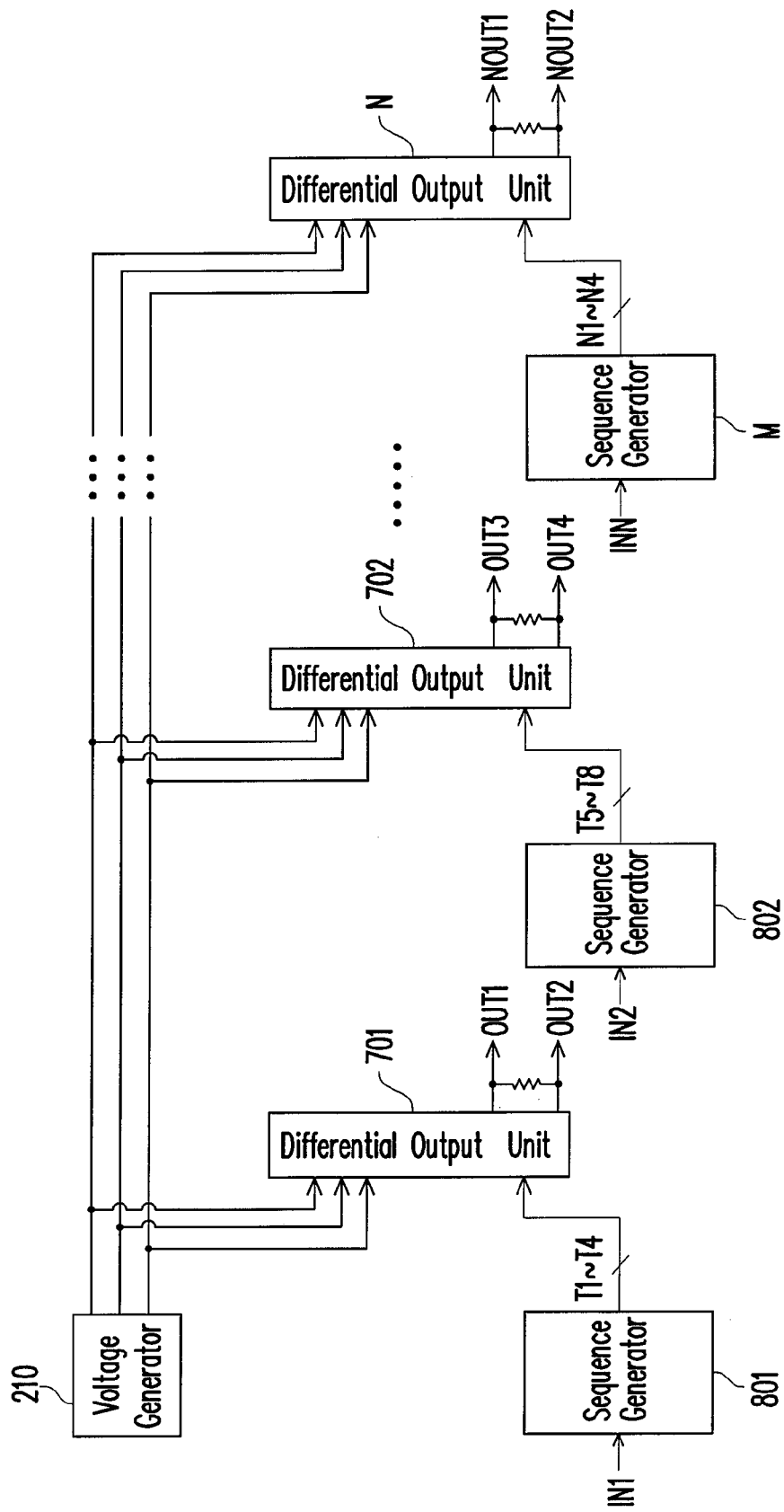
FIG. 7 is a schematic view of a voltage generator and a plurality of differential output units connected in series according to an embodiment of the present invention.

FIG. 7 is a schematic view of a voltage generator and a plurality of differential output units connected in series according to an embodiment of the present invention. Referring to FIG. 7, the user can use a single voltage generator 210 to connect differential output units 701-N, and make each of the differential output units to generate the required sequence signals through the sequence generator. For example, a sequence generator 801 is utilized to receive an input signal IN1 to generate the sequence signals T1-T4 for the differential output unit 701, a sequence generator 802 is utilized to receive an input signal IN2 to generate the sequence signals T5-T8 for the differential output unit 702, and a sequence generator M is used to receive an input signal INN to generate the sequence signals N1-N4 for the differential output unit N.

In this way, the input signals containing communication messages are converted into the output signals of differential type. According to the figures, the input signal IN1 is converted into the output signals OUT1 and OUT2, the input signal IN2 is converted into the output signals OUT3 and OUT4, and the input signal INN is converted into the output signals NOUT1 and NOUT2, thereby further reducing EMI and power consumption.

Since the voltage generator directly provides the common mode voltage to the differential output unit according to the present invention, the circuit has a short response time and the optimized conditions thereof will not easily drift with the variation of the processes. In the present invention, a first amplifier circuit is also adopted in the voltage generator to clamp the drain voltage of the first PMOS transistor and the second NMOS transistor within the predetermined reference voltage, thereby overcoming the channel modulation effect of the MOS transistor. Therefore, the output current of the differential output unit is made to be proportional to the reference current of the voltage generator only by adjusting the sizes of the first PMOS transistor, the second NMOS transistor, the first controlled current source (e.g. a PMOS transistor), and the second controlled current source (e.g. an NMOS transistor).

In addition, a second amplifier circuit is also adopted in the voltage generator to provide current to maintain the common mode voltage at the level of the reference voltage. Therefore, in the present invention, only one voltage generator is required to connect a plurality of differential output units in series, so that the circuit area of the present invention is smaller than that of the conventional circuit, thereby reducing the cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low differential output voltage circuit, comprising:
   a voltage generator, comprising:
   a first NMOS transistor, having a drain and a gate connected to the drain, wherein the drain of the first NMOS transistor receives a reference current, and a source of the first NMOS transistor is coupled to a common potential;
   a second NMOS transistor, having a source coupled to the common potential, and a gate coupled to the gate of the first NMOS transistor;
   a first PMOS transistor, having a source coupled to a source voltage, and a drain coupled to a drain of the second NMOS transistor; and
   a first amplifier circuit, having a positive input end coupled to the drain of the second NMOS transistor and the drain of the first PMOS transistor for clamping the voltages of the two drains at the reference voltage, a negative input end coupled to a reference voltage, and an output end coupled to a gate of the first PMOS transistor, wherein the reference voltage serves as the clamping voltage;
   a plurality of differential output units, each comprising:
   a first controlled current source, coupled to the output end of the first amplifier circuit, and providing a current of a value clamped within a first predetermined range according to the voltage of the above output end;
   a first switch, having a first end coupled to the first controlled current source, a second end, and a control end receiving a first sequence signal to determine whether or not to turn on;
   a second switch, having a first end coupled to the first controlled current source, a second end, and a control end receiving a second sequence signal to determine whether or not to turn on;
   a third switch, having a first end coupled to the second end of the first switch and outputting a first output signal, a second end, and a control end receiving a third sequence signal to determine whether or not to turn on;
   a fourth switch, having a first end coupled to the second end of the second switch and outputting a second output signal, a second end, and a control end receiving a fourth sequence signal to determine whether or not to turn on;
   a second controlled current source, coupled to the gate of the second NMOS transistor, the second end of the third switch, and the second end of the fourth switch, and providing a current of a value clamped within a second predetermined range according to the gate voltage of the second NMOS transistor; and
   a common mode voltage circuit, for clamping the common mode voltage of the first output signal and the second output signal within a third predetermined range according to the clamping voltage.

2. The low differential output voltage circuit as claimed in claim 1, wherein the first switch and the second switch respectively comprise a PMOS transistor having a source, a drain, and a gate respectively serving as the first end, the second end, and the control end of the first switch, and respectively serving as the first end, the second end, and the control end of the second switch; and the third switch and the fourth switch respectively comprise an NMOS transistor having a source, a drain, and a gate respectively serving as the first end, the second end, and the control end of the third switch, and respectively serving as the first end, the second end, and the control end of the fourth switch.

3. The low differential output voltage circuit as claimed in claim 2, wherein the first controlled current source comprises a PMOS transistor having a source coupled to the source voltage, a drain coupled to the source of the first switch and the source of the second switch, and a gate coupled to the output end of the first amplifier circuit; and the second controlled current source comprises an NMOS transistor having a drain coupled to the source of the third switch and the source of the fourth switch, a source coupled to the common potential, and a gate coupled to the gate of the second NMOS transistor.

4. The low differential output voltage circuit as claimed in claim 3, wherein a size of the first PMOS transistor is proportional to a size of the PMOS transistor serving as the first controlled current source, and a size of the second NMOS transistor is proportional to a size of the NMOS transistor serving as the second controlled current source; sizes of the PMOS transistor serving as the first switch and the PMOS transistor serving as the second switch are the same, and sizes of the NMOS transistor serving as the third switch and the NMOS transistor serving as the fourth switch are the same.

5. The low differential output voltage circuit as claimed in claim 1, wherein the voltage generator further comprises:
   a voltage source, having a negative end coupled to the common potential, a positive end coupled to the negative input end of the first amplifier circuit, for outputting the reference voltage.

6. The low differential output voltage circuit as claimed in claim 1, wherein the voltage generator further comprises:
   a unit gain stage, for receiving the reference voltage, and enhancing the driving ability of the reference voltage, so as to output the reference voltage as the clamping voltage.

7. The low differential output voltage circuit as claimed in claim 1, wherein the unit gain stage comprises a second amplifier circuit having a positive input end receiving the reference voltage, a negative input end, and an output end outputting and feeding the clamping voltage back to the negative input end of the second amplifier circuit.

8. The low differential output voltage circuit as claimed in claim 1, wherein the voltage generator further comprises:
   a first impedor, with one end coupled to the drain of the first PMOS transistor, and the other end coupled to the positive input end of the first amplifier circuit; and
   a second impedor, with one end coupled to the drain of the second NMOS transistor, and another end coupled to the other end of the first impedor and the positive input end of the first amplifier circuit.

9. The low differential output voltage circuit as claimed in claim 8, wherein the first impedor comprises a PMOS transistor having a source coupled to the drain of the first PMOS transistor, a drain coupled to the positive input end of the first amplifier circuit, and a gate coupled to the common potential; and the second impedor comprises an NMOS transistor having a source coupled to the drain of the second NMOS transistor, a drain coupled to the positive input end of the first amplifier circuit, and a gate coupled to a bias voltage.

10. The low differential output voltage circuit as claimed in claim 9, wherein a size of the first PMOS transistor is proportional to the size of the PMOS transistor serving as the first controlled current source, a size of the PMOS transistor serving as the first impedor is proportional to a size of the PMOS transistor serving as the first switch, a size of the NMOS transistor serving as the second impedor is proportional to the size of the NMOS transistor serving as the fourth switch, and a size of the second NMOS transistor is proportional to the size of the NMOS transistor serving as the second controlled current source; sizes of the PMOS transistor serving as the first switch and the PMOS transistor serving as the second switch are the same, and sizes of the NMOS transistor serving as the third switch and the NMOS transistor serving as the fourth switch are the same.

11. The low differential output voltage circuit as claimed in claim 1, wherein the common mode voltage circuit comprises:
   a third impedor, with one end receiving the first output signal; and
   a fourth impedor, with one end receiving the second output signal, and another end coupled to another end of the third impedor and the clamping voltage.

12. The low differential output voltage circuit as claimed in claim 11, wherein the third impedor and the fourth impedor respectively comprise a resistor.

13. The low differential output voltage circuit as claimed in claim 1, further comprising:
   a sequence generator, for generating the first sequence signal, the second sequence signal, the third sequence signal, and the fourth sequence signal according to an input signal.

* * * * *